United States Patent [19]

Masumoto et al.

[11] Patent Number: 5,792,676
[45] Date of Patent: Aug. 11, 1998

[54] METHOD OF FABRICATING POWER SEMICONDUCTOR DEVICE AND LEAD FRAME

[75] Inventors: Toshikazu Masumoto; Shinobu Takahama, both of Tokyo, Japan

[73] Assignee: Mitsubishi Denki Kabushiki Kaisha, Tokyo, Japan

[21] Appl. No.: 658,611

[22] Filed: Jun. 5, 1996

[30] Foreign Application Priority Data

Oct. 3, 1995 [JP] Japan ................. 7-256056

[51] Int. Cl.⁶ ................................. H01L 21/28
[52] U.S. Cl. ............... 438/111; 438/112; 438/113; 257/670; 257/672; 257/674; 257/676; 257/692
[58] Field of Search ................. 438/111, 112, 438/123, 366, 367, 377, 380; 257/670, 672, 674, 676, 692

[56] References Cited

U.S. PATENT DOCUMENTS

| | | |
|---|---|---|
| 4,794,431 | 12/1988 | Park . |
| 5,147,815 | 9/1992 | Casto . |
| 5,313,095 | 5/1994 | Tagawa et al. . |
| 5,438,021 | 8/1995 | Tagawa et al. . |

FOREIGN PATENT DOCUMENTS 5-299576  11/1993  Japan .

*Primary Examiner*—David Graybill
*Attorney, Agent, or Firm*—Oblon, Spivak, McClelland, Maier & Neustadt, P.C.

[57] ABSTRACT

Disclosed herein are a method of fabricating a power semiconductor device having joiners that (205) vertically extend from outer sides of leads (203, 204) of a tie bar (201) of a power circuit lead frame (20) respectively, while joiners (308) vertically extend from outer sides of leads (303, 307) of a tie bar (301) of a control circuit lead frame (30) respectively to be opposed thereto. Forward end portions (205a) of the joiners (205) are joined to rear surfaces of forward end portions (308a) of the joiners (308) at a device center portion.

12 Claims, 15 Drawing Sheets

METHOD OF FABRICATING POWER SEMICONDUCTOR DEVICE AND LEAD FRAME

BACKGROUND OF THE INVENTION

1. Field of the Invention

The present invention relates to a method of fabricating a power semiconductor device and a lead frame, and more particularly, it relates to a method of fabricating a power semiconductor device having a semiconductor power chip such as a power transistor or a power MOSFET and a control semiconductor chip for controlling the semiconductor power chip which are stored in the same package, and a lead frame.

2. Description of the Background Art

With reference to FIGS. 20 and 21, a conventional method of fabricating a power semiconductor is described. FIG. 20 is a plan view showing a step in an intermediate stage of fabrication of a conventional power semiconductor device.

Referring to FIG. 20, a power circuit lead frame 2 and a control circuit lead frame 3 are oppositely arranged to inwardly direct leads which are provided thereon respectively. Leads 22 to 24 extend from a tie bar 21 of the power circuit lead frame 2, and a power semiconductor chip 4 is loaded on a forward end portion 22a of the lead 22.

On the other hand, leads 32 to 37 extend from a tie bar 31 of the control circuit lead frame 3, and a control semiconductor chip 5 for controlling the power semiconductor chip 4 is loaded on a forward end portion 32a of the lead 32.

The forward end portion 32a of the lead 32 is placed on the forward end portion 22a of the lead 22 through an insulating sheet 8.

The power semiconductor chip 4 is electrically connected with the leads 23 and 24 through aluminum wires 6, while the control semiconductor chip 5 is electrically connected with the leads 33 to 37 by gold wires 7.

The lead 24 is so branched that the branched forward end thereof extends to a portion close to the lead 37, and is electrically connected with the lead 37 through a gold wire 7.

The power semiconductor chip 4 and the control semiconductor chip 5 as well as most parts of the leads 22 to 24 and 32 to 37 are covered with a protective resin member 10. For the purpose of simplification, FIG. 20 shows the protective resin member 10 by broken lines.

As hereinabove described, the power semiconductor device has the power semiconductor chip 4, and hence it is necessary to take radiation of heat which is generated from the power semiconductor chip 4 into consideration. Therefore, the power circuit lead frame 2 must be made of a metal such is copper having excellent heat conductivity, while its thickness must be relatively large.

On the other hand, the control circuit lead frame 3 to be loaded with the control semiconductor chip 5 must be provided with a large number of pins and finely packaged, in association with functional improvement of the control semiconductor chip 5. Thus, a copper material having a small thickness and high workability must inevitably be employed.

In order to satisfy both conditions, the thicknesses of the power circuit lead frame 2 and the control circuit lead frame 3 must be different from each other.

FIG. 21 is a sectional view taken along the line A—A in FIG. 20. As shown in FIG. 21, the thickness of the power circuit lead frame 2 is larger than that of the control circuit lead frame 3.

Steps of fabricating the conventional power semiconductor device are now described. The power circuit lead frame 2 and the control circuit lead frame 3 are carried along carriage lines therefor respectively. As to the power circuit lead frame 2 and the control circuit lead frame 3, the structures shown in FIG. 20 are continuously formed in plural respectively, to form long plates.

In an intermediate stage of such carriage, the insulating sheet 8 is placed on the forward end portion 22a of the lead 22 of the power circuit lead frame 2, and the forward end portion 32a of the lead 32 of the control circuit lead frame 3 is placed thereon.

In this state, the long power and control circuit lead frames 2 and 3 are cut every prescribed length. The portions which are cut into the prescribed length are called frame units.

The frame units are successively fed to a die bonding apparatus (die bonder), so that the power semiconductor chip 4 is die-bonded to a portion of the forward end portion 22a of the lead 22 of each power circuit lead frame 2 which is not covered with the insulating sheet 8. Further, the control semiconductor chip 5 is die-bonded to the forward end portion 32a of the lead 32 of each control circuit lead frame 3.

Each frame unit which is completely die-bonded is fed to a wire bonding apparatus (wire bonder) for aluminum wires, so that the aluminum wires 6 are wire-bonded between respective terminals of the power semiconductor chip 4 and the leads 23 and 24.

Then, the gold wires 7 are wire-bonded between respective terminals of the control semiconductor chip 5 and the leads 33 to 37 and between the lead 37 and the branched forward end portion of the lead 24 respectively in a wire bonding apparatus for gold wires.

Each frame unit completely wire-bonded with the gold wires is carried into a molding apparatus, and engaged in a mold assembly. Then, the protective resin member 10 is formed by transfer molding.

In the frame unit provided with the protective resin member 10, the tie bars 21 and 31 of the power and control circuit lead frames 2 and 3 are cut to complete an independent power semiconductor device.

The conventional power semiconductor device, which is fabricated into the aforementioned structure through the aforementioned steps, has the following problems:

While the frame unit is subjected to the respective steps of die bonding, wire bonding and transfer molding, the power circuit lead frame 2 and the control circuit lead frame 3 are substantially separated from each other during these steps. In this state, the power and control circuit lead frames 2 and 3 may be misregistered from each other during carriage between the steps. In particular, the frame unit must be raised up to be transferred from the wire bonding step to the transfer molding step. In this case, it is not easy to carry the frame unit without disengaging the fine aluminum and gold wires 6 and 7 and without misregistering the two lead frames but the wires man be disengaged or the two lead frames may be misregistered to increase the defective ratio in the steps. Thus, automation is hard to attain.

Further, the forward end portion 32a of the lead 32 is placed on the forward end portion 22a of the lead 22 through the insulating sheet 8, and hence the rear surface of the power circuit lead frame 2 is not flush with that of the control circuit lead frame 3, as shown in FIG. 21.

While a lead frame is placed on a flat heating plate called a "heat platen" to be heated in die bonding, the control circuit lead frame 3 is not directly brought into contact with such a heat platen, and hence radiation efficiency is disadvantageously deteriorated. A similar problem is caused also in wire bonding of the gold wires, due to a similar heating method.

SUMMARY OF THE INVENTION

According to a first aspect of the present invention, a method of fabricating a power semiconductor device having a power semiconductor element and a control semiconductor element for controlling the power semiconductor element which are stored in the same package comprises (a) a step of preparing a power circuit lead frame comprising a power lead group unidirectionally extending from a first tie bar and including a first lead having a power semiconductor element mounting region which is loaded with the power semiconductor element, and at least one first joiner which is formed on the first tie bar on a side of the power lead group to extend in the same direction as the power lead group, (b) a step of preparing a control circuit lead frame comprising a control lead group unidirectionally extending from a second tie bar and including a second lead having a control semiconductor element mounting region which is loaded with the control semiconductor element, and at least one second joiner which is formed on the second tie bar on a side of the control lead group to extend in the same direction as the control lead group, (c) a step of arranging the power circuit lead frame and the control circuit lead frame to oppose the power lead group and the control lead group to each other and joining forward end portions of the first and second joiners with each other thereby integrating the power circuit lead frame and the control circuit lead frame with each other, (d) a step of loading the power semiconductor element on the power semiconductor element mounting region and electrically connecting the same with the power lead group, (e) a step of loading the control semiconductor element on the control semiconductor element mounting region and electrically connecting the same with the control lead group, and (f) a step of storing the power semiconductor element and the control semiconductor element in the same package by resin molding, and the steps (d) to (f) are carried out in a state of integrating the power circuit lead frame and the control circuit lead frame with each other through the step (c).

According to a second aspect of the present invention, the control circuit lead frame is made of a material satisfying at least either one of conditions of being smaller in thickness than the power circuit lead frame or being easier in working than the power circuit lead frame, the step (b) includes a step of bending the forward end portion of the second joiner while placing the same on the forward end portion of the first joiner so that rear surfaces of the power semiconductor element mounting region and the control semiconductor element mounting region are flush with each other, and the step (c) includes a step of placing the forward end portion of the second joiner on that of the first joiner and soldering the same to each other.

According to a third aspect of the present invention, the control circuit lead frame is made of a material which is smaller in thickness than the power circuit lead frame, the step (a) includes a step of forming a notched step portion having a vertical difference corresponding to the thickness of the control circuit lead frame on an upper surface of the forward end portion of the first joiner, the step (b) includes a step of bending the forward end portion of the second joiner while placing the same on the forward end portion of the first joiner so that rear surfaces of the power semiconductor element mounting region and the control semiconductor element mounting region are flush with each other, and the step (c) includes a step of placing the forward end portion of the second joiner on the notched step portion of the first joiner and soldering the same to each other.

According to a fourth aspect of the present invention, the control circuit lead frame is made of a material which is smaller in thickness than the power circuit lead frame, the step (a) includes a step of forming a notched step portion having a vertical difference corresponding to the thickness of the control circuit lead frame on a rear surface of the forward end portion of the first joiner, and the step (c) includes a step of covering the forward end portion of the second joiner with the notched step portion of the first joiner and soldering the same to each other.

According to a fifth aspect of the present invention, the control circuit lead frame is made of a material satisfying at least either one of conditions of being smaller in thickness than the power circuit lead frame or being easier in working than the power circuit lead frame, the step (a) includes a step of forming a through hole passing through the forward end portion of the first joiner, the step (b) includes a step of bending the forward end portion of the second joiner while placing the same on the forward end portion of the first joiner so that rear surfaces of the power semiconductor element mounting region and the control semiconductor element mounting region are flush with each other, and the step (c) includes a step of placing the forward end portion of the second joiner on that of the first joiner and inserting the same into the through hole by press working.

According to a sixth aspect of the present invention, the control circuit lead frame is made of a material which is smaller in thickness than the power circuit lead frame, the step (a) includes a step of forming a notched step portion having a vertical difference corresponding to the thickness of the control circuit lead frame on an upper surface of the forward end portion of the first joiner, and a step of forming a through hole in the notched step portion, the step (b) includes at step of bending the forward end portion of the second joiner while placing the same on the notched step portion of the first joiner so that rear surfaces of the power semiconductor element mounting region and the control semiconductor element mounting region are flush with each other, and the step (c) includes a step of placing the forward end portion of the second joiner on the notched step portion of the first joiner and inserting the same into the through hole by press working.

According to a seventh aspect of the present invention, the control circuit lead frame is made of a material which is smaller in thickness than the power circuit lead frame, the step (a) includes a step of forming a notched step portion having a vertical difference corresponding to the thickness of the control circuit lead frame on a rear surface of the forward end portion of the first joiner, and a step of forming a through hole in the notched step portion, and the step (c) includes a step of covering the forward end portion of the second joiner with the notched step portion of the first joiner and inserting the same into the through hole by press working.

According to an eighth aspect of the present invention, a lead frame employed for fabricating a power semiconductor device having a power semiconductor element and a control semiconductor element for controlling the power semiconductor element which are stored in the same package comprises a power circuit lead frame comprising a power lead group unidirectionally extending from a first tie bar and including a first lead having a power semiconductor element mounting region which is loaded with the power semiconductor element, and at least one first joiner which is formed on the first tie bar on a side of the power lead group to extend in the same direction as the power lead group, and a control circuit lead frame comprising a control lead group unidirectionally extending from a second tie bar and including a second lead having a control semiconductor element mounting region which is loaded with the control semiconductor element, and at least one second joiner which is formed on the second tie bar on a side of the control lead group to extend in the same direction as the control lead group, and the power circuit lead frame and the control circuit lead frame are so arranged that the power lead group and the control lead group are opposed to each other and rear surfaces of the power semiconductor element mounting region and the control semiconductor element mounting region are flush with each other, while forward end portions of the first and second joiners are joined with each other.

According to a ninth aspect of the present invention, the control circuit lead frame is made of a material satisfying at least either one of conditions of being smaller in thickness than the power circuit lead frame or being easier in working than the power circuit lead frame, while those of the leads of the power lead group and the control lead group having potentials in common are directly joined with each other.

In the method of fabricating a power semiconductor device according to the first aspect of the present invention, the forward end portions of the first and second joiners are joined with each other to integrate the power circuit lead frame and the control circuit lead frame with each other through the step (c) so that the device is structurally strengthened, while the steps (d) to (f) are carried out in this state, whereby the power circuit lead frame and the control circuit lead frame are prevented from misregistration in arrangement and deformation in movement between the steps, the defective ratio in the steps is reduced and automation of fabrication is simplified.

In the method of fabricating a power semiconductor device according to the second aspect of the present invention, the power circuit lead frame and the control circuit lead frame are integrated with each other in such a state that the power semiconductor element mounting region and the control semiconductor element are mounting region flush with each other, whereby the lead frame; can be placed on a flat heating plate to be efficiently heated when it is necessary to heat the same in the steps (c) to (e).

In the method of fabricating a power semiconductor device according to the third aspect of the present invention, the forward end portion of the second joiner is joined in a state being placed on the notched step portion of the first joiner so that the same will not project from the upper surface of the first joiner, whereby a jig for electrical connection can be prevented from colliding with the forward end portion of the second joiner in electrical connection in the steps (d) and (e), for reducing the defective ratio in the steps.

In the method of fabricating a power semiconductor device according to the fourth aspect of the present invention, the forward end portion of the second joiner may not be bent, whereby the fabrication steps are simplified and the degree of integration can be improved due to provision of no bent portion.

In the method of fabricating a power semiconductor device according to the fifth aspect of the present invention, the forward end portion of the second joiner is placed on that of the first joiner and inserted into the through hole by press working thereby joining the first and second joiners with each other, whereby the step for joining can be simplified as compared with the case of joining the first and second joiners with each other by soldering.

In the method of fabricating a power semiconductor device according to the sixth aspect of the present invention, the forward end portion of the second joiner is joined in a state being placed on the notched step portion of the first joiner so that the same will not project from the upper surface of the first joiner, whereby a jig for electrical connection can be prevented from colliding with the forward end portion of the second joiner in electrical connection in the steps (d) and (e), for reducing the defective ratio in the steps. Further, the forward end portion of the second joiner is inserted into the through hole by press working thereby joining the first and second joiners with each other, whereby the step for joining can be simplified as compared with the case of joining the first and second joiners with each other by soldering.

In the method of fabricating a power semiconductor device according to the seventh aspect of the present invention, the forward end portion of the second joiner may not be bent, whereby the fabrication steps are simplified and the degree of integration can be improved due to provision of no bent portion. Further, the forward end portion of the second joiner is inserted into the through hole by press working thereby joining the first and second joiners with each other, whereby the step for joining can be simplified as compared with the case of joining the first and second joiners with each other by soldering.

In the lead frame according to the eighth aspect of the present invention, the forward end portions of the first and second joiners are joined with each other thereby integrating the power circuit lead frame and the control circuit lead frame with each other so that the device is structurally strengthened, whereby the power circuit lead frame and the control circuit lead frame are prevented from misregistration in arrangement and deformation in carriage.

In the lead frame according to the ninth aspect of the present invention, the leads of the power lead group and the control lead group are directly joined with each other, whereby a lead frame which is structurally stronger can be attained in association with junction between the first and second joiners.

An object of the present invention is to provide a method of fabricating a power semiconductor device which is excellent in heat radiation of at power semiconductor chip and copes with improvement in function, increase in pin number and package refinement of a control semiconductor chip, and a lead frame simplifying automation of assembling.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Embodiment 1>
<Device Structure>

Figure 1:
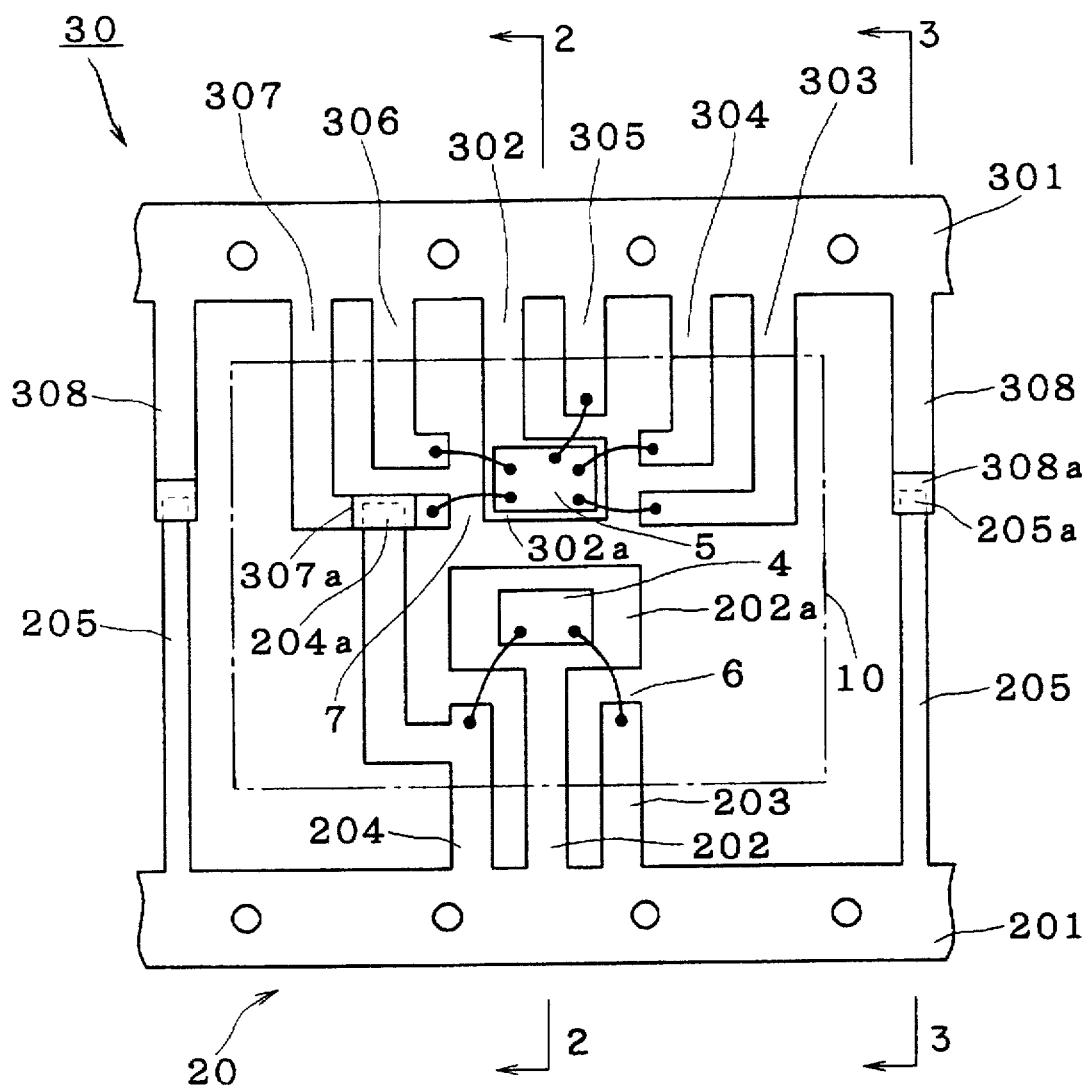
FIG. 1 illustrates an embodiment 1 according to the present invention.

FIG. 1 is a plan view showing a step included in those of fabricating a power semiconductor device which is formed by an embodiment 1 of a method of fabricating a power semiconductor device according to the present invention.

Referring to FIG. 1, a power circuit lead frame 20 and a control circuit lead frame 30 are oppositely arranged to inwardly direct leads provided thereon respectively.

Leads 202 to 204 extend from a tie bar 201 of the power circuit lead frame 20, and a power semiconductor chip 4 is loaded on a lead forward end portion 202a of the lead 202.

On the other hand, leads 302 to 307 extend from a tie bar 301 of the control circuit lead frame 30, and a control semiconductor chip 5 for controlling the power semiconductor chip 4 is loaded on a lead forward end portion 302a of the lead 302.

The lead forward end portions 202a and 302a of the leads 202 and 302 are provided substantially at the center to be opposed to each other, in a state of oppositely arranging the power circuit lead frame 20 and the control circuit lead frame 30. A portion around the lead forward end portions 202a and 302a of the leads 202 and 302 is hereinafter referred to a device center part.

The power semiconductor chip 4 is electrically connected to the leads 203 and 204 by aluminum wires 6, while the control semiconductor chip 5 is electrically connected to the leads 303 to 307 by gold wires 7.

The lead 204 is so branched that its branched lead forward portion 204a is bonded to a side (hereinafter referred to as a rear side) of the lead 307 which is opposite to that loaded with the power semiconductor chip 4. The lead 307 is so bent that its portion joined with the lead forward portion 204a extends over the lead forward end portion 204a.

Further, joiners 205 vertically extend from outer sides of the leads 203 and 204 in the tie bar 201 of the power circuit lead frame 20 respectively, while joiners 308 vertically extend from outer sides of the leads 303 and 307 in the tie bar 301 of the control circuit lead frame 30 respectively, to be opposed to the joiners 205. Joiner forward portions 205a of the joiners 205 are joined with rear sides of joiner forward end portions 308a of the joiners 308 in the device center portion. The junctions of the joiner forward end portions 308a with the joiner forward end portions 205a are bent to cover the joiner forward end portions 205a.

The power semiconductor chip 4, the control semiconductor chip 5, and most parts of the leads 202 to 204 and 302 to 307 are covered with a protective resin member 10. Referring to FIG. 1, the protective resin member 10 is shown by broken lines, for the purpose of simplification.

Figure 2:
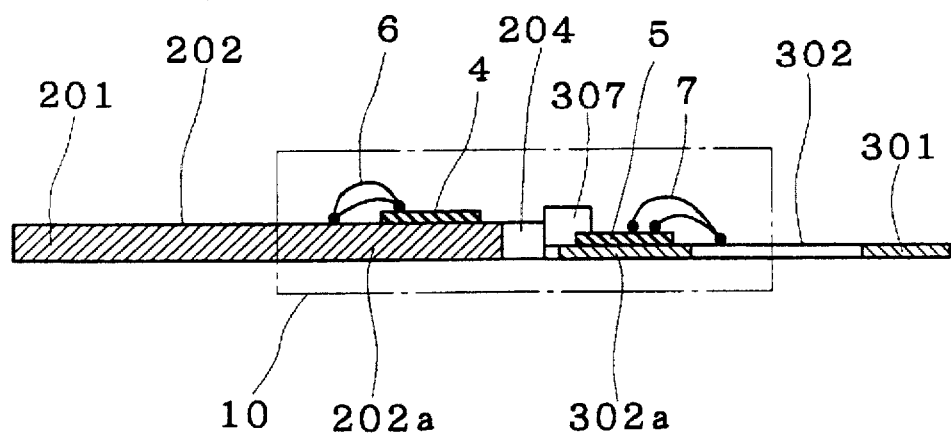
FIG. 2 illustrates the embodiment 1 according to the present invention.

FIG. 2 is a sectional view taken along the line A—A in FIG. 1. As shown in FIG. 2, the thickness of the power circuit lead frame 20 is larger than that of the control circuit lead frame 30. Further, the rear surfaces of these lead frames 20 and 30 are flush with each other. The thicknesses of the power circuit lead frame 20 and the control circuit lead frame 30, which may be selected at various values, are 0.85 mm and 0.25 mm respectively, for example.

Furthermore, the thickness of the power circuit lead frame 20 ranges from almost as large as that of the control circuit lead frame 30 to almost ten times as large.

Figure 3:
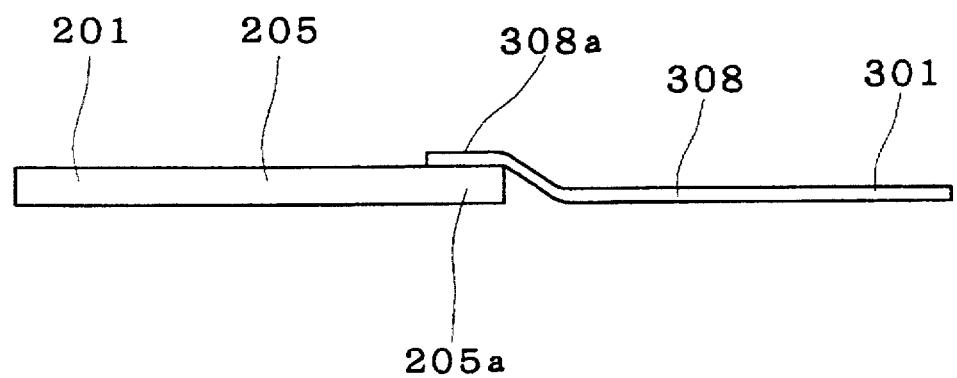
FIG. 3 illustrates the embodiment 1 according to the present invention.

FIG. 3 is a sectional view taken along the line B—B in FIG. 1. As shown in FIG. 3, the junction of each joiner forward end portion 308a with each joiner forward end portion 205a is bent to cover the joiner forward end portion 205a, and the rear surface of the joiner 308 excluding the joiner forward end portion 308a is flush with that of the joiner 205.

<Fabrication Steps>

Figure 4:
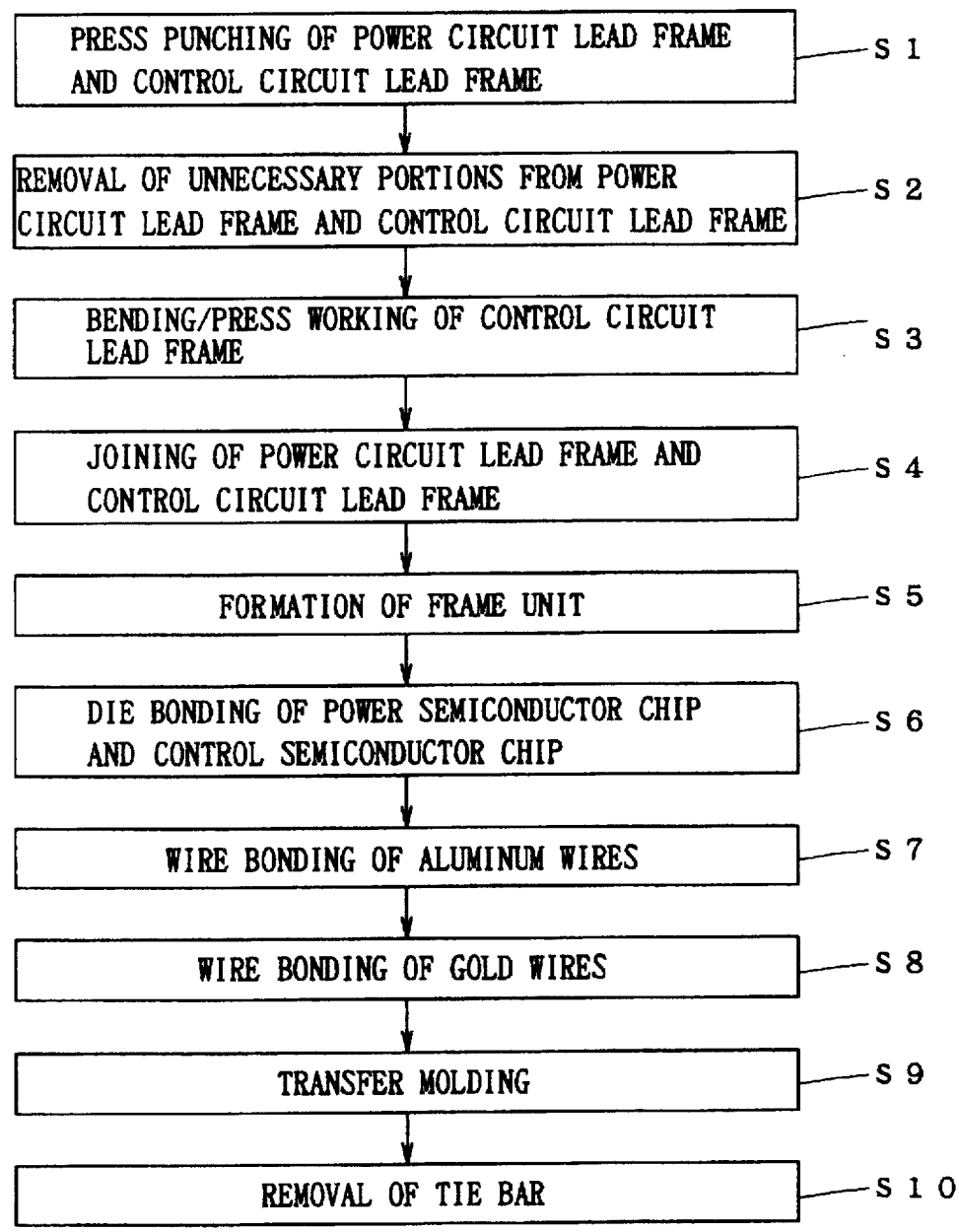
FIG. 4 is a flow chart showing steps of fabricating the embodiment 1 according to the present invention.

The fabrication steps are now described with reference to FIGS. 4 to 11. FIG. 4 is a flow chart of the fabrication steps. At a step S1, the power circuit lead frame 20 and the control circuit lead frame 30 are punched out from long plate members having different thicknesses by pressing respectively.

Figure 5:
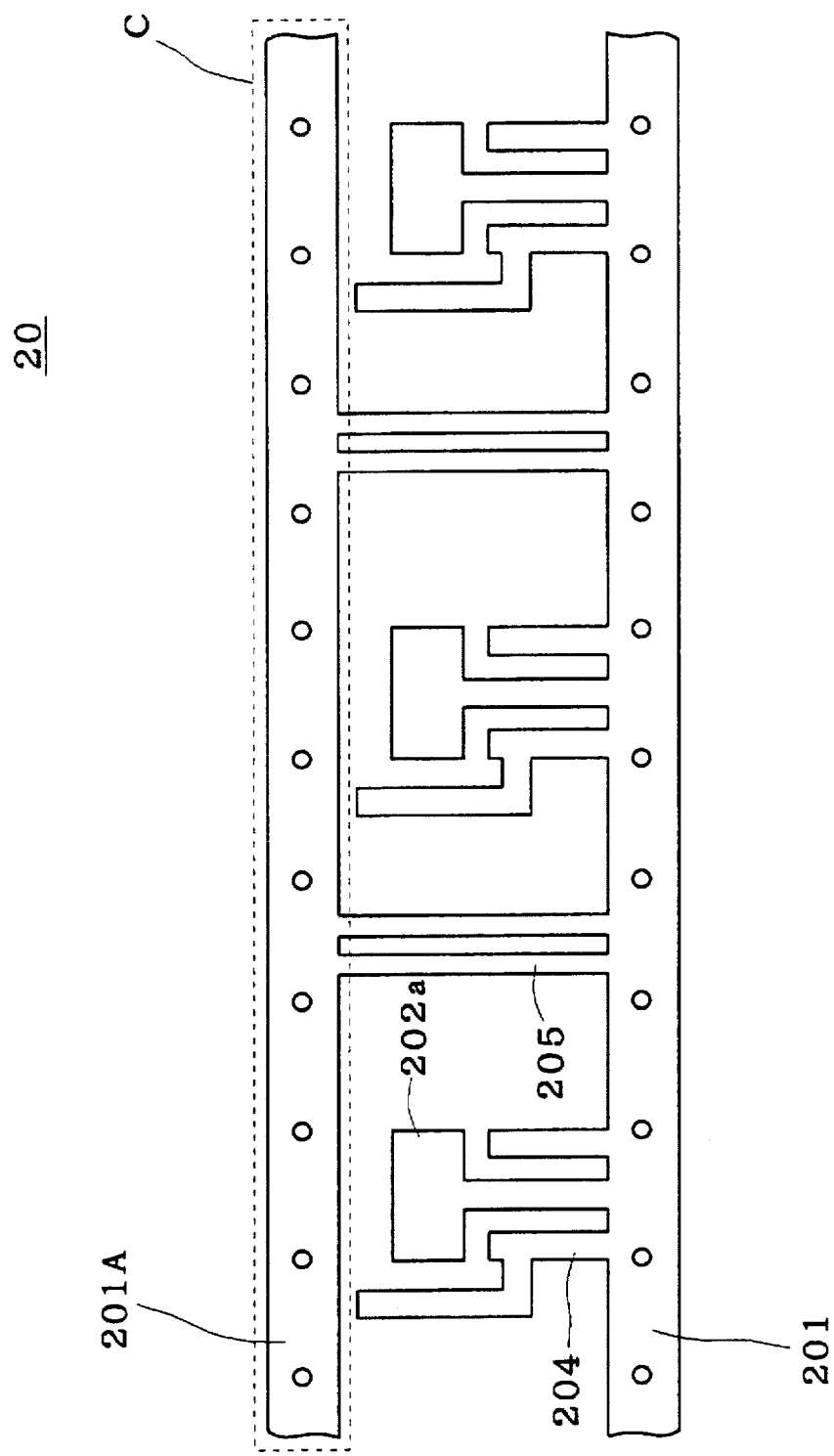
FIG. 5 illustrates a step of fabricating the embodiment 1 according to the present invention.
Figure 6:
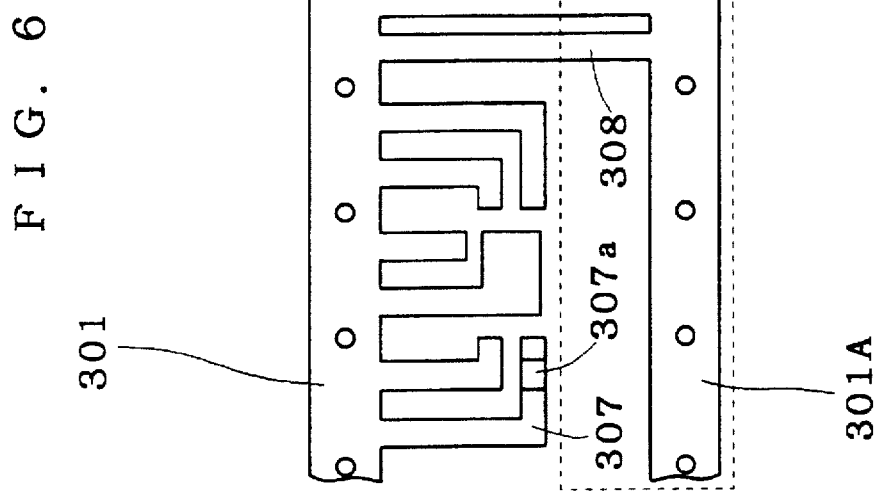
FIG. 6 illustrates a step of fabricating the embodiment 1 according to the present invention.

FIGS. 5 and 6 show the power circuit lead frame 20 and the control circuit lead frame 30 which are formed by press punching respectively. As shown in FIG. 5, the power circuit lead frame 20 has a tie bar 201A which is opposed to the tie bar 201 at this point of time, and these tie bars 201A and 201 are connected with each other through the joiners 205. As shown in FIG. 6, on the other hand, the control circuit lead frame 30 also has a tie bar 301A which is opposed to the tie bar 301, and these tie bars 301A and 301 are connected with each other through the joiners 308. At the same time, a junction 307a of the lead 307 with the lead forward end portion 204a is bent to extend over the lead forward end portion 204a.

At a step S2, unnecessary portions of the power circuit lead frame 20 and the control circuit lead frame 30 are removed by cutting, as shown by broken lines C and D respectively.

The power circuit lead frame 20 and the control circuit lead frame 30 from which the unnecessary portions are completely removed are carried along carriage lines therefor respectively, so that a junction of the joiner forward end portion 308a with the joiner forward end portion 205a is bent/press-worked in the control circuit lead frame 30 at a step S3.

At a step S4, the power circuit lead frame 20 and the control circuit lead frame 30 are transferred to a common carriage line, and oppositely arranged to inwardly direct the leads provided thereon respectively. At this time, the lead forward end portion 204a is positioned under the junction 307a of the lead 307, while the joiner forward end portion 205a is positioned under the bent/bend-worked portion of the joiner forward end portion 308a. The lead forward end portion 204a and the junction 307a as well as the joiner forward end portions 205a and 308a are joined with each other by soldering, for example, thereby forming a long joined lead frame. The joining method is not restricted to soldering.

Figure 7:
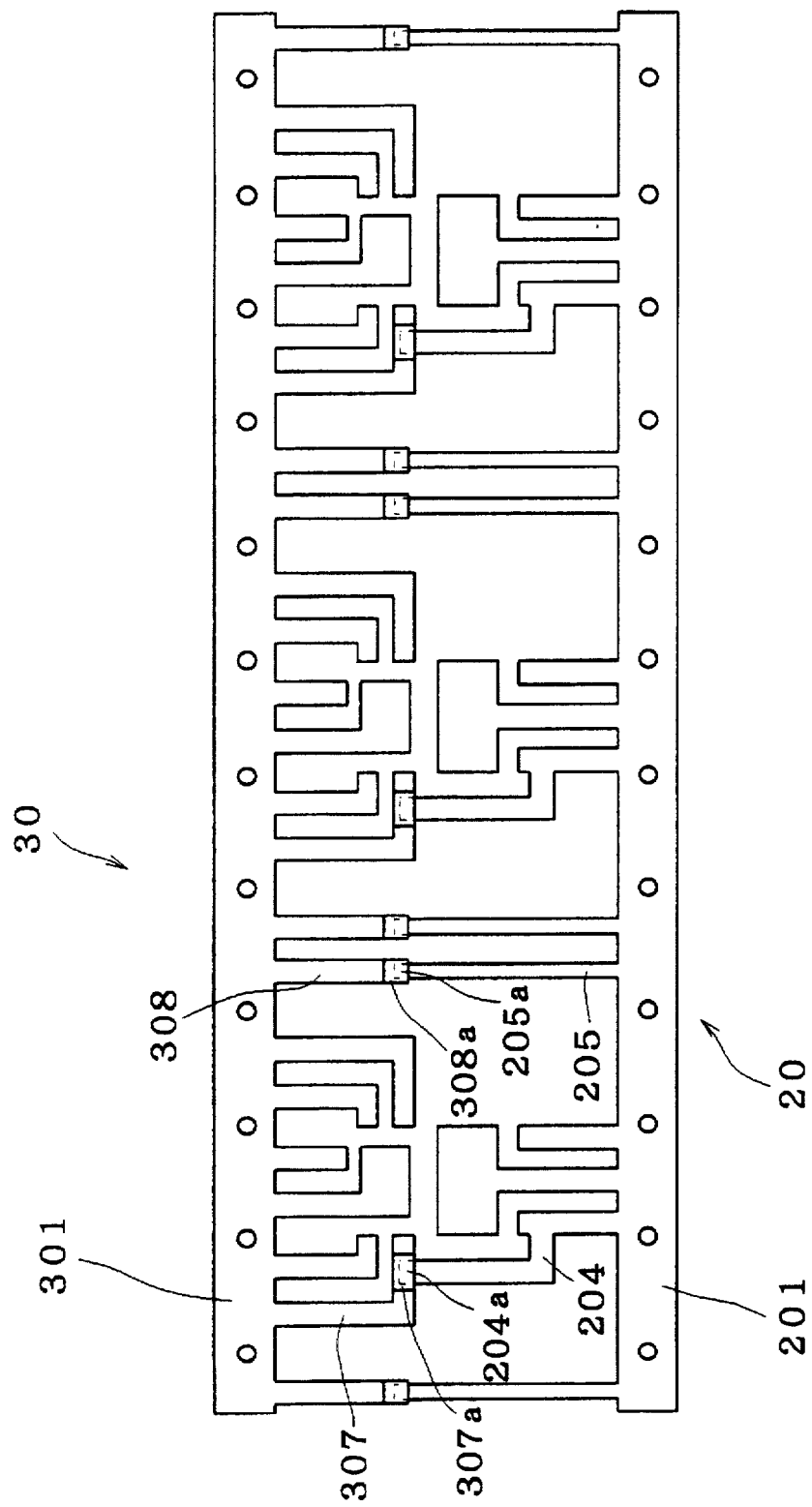
FIG. 7 illustrates a step of fabricating the embodiment 1 according to the present invention.

At a step S5, the joined lead frame is cut into prescribed lengths. The portions which are cut into the prescribed lengths are called frame units FU. FIG. 7 is a plan view showing an exemplary frame unit FU.

Figure 8:
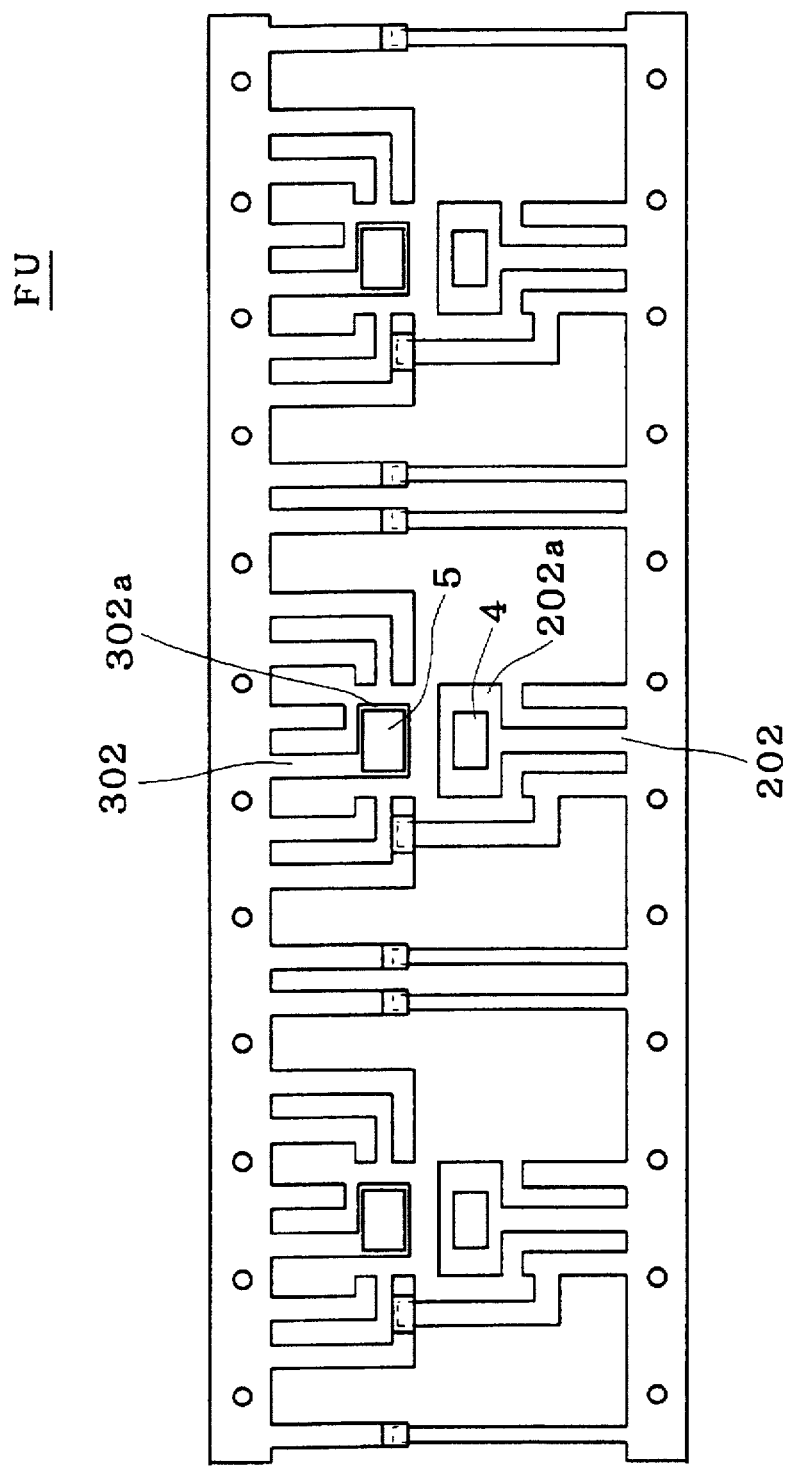
FIG. 8 illustrates a step of fabricating the embodiment 1 according to the present invention.

At a step S6, the frame units FU are successively transferred to a die bonding apparatus (die bonder), so that the power semiconductor chip 4 is die-bonded to the forward end portion 202a of the lead 202 of each power circuit lead frame 20, as shown in FIG. 8. Further, the control semiconductor chip 5 is die-bonded to the forward end portion 302a of the lead 302 of each control circuit lead frame 30.

Figure 9:
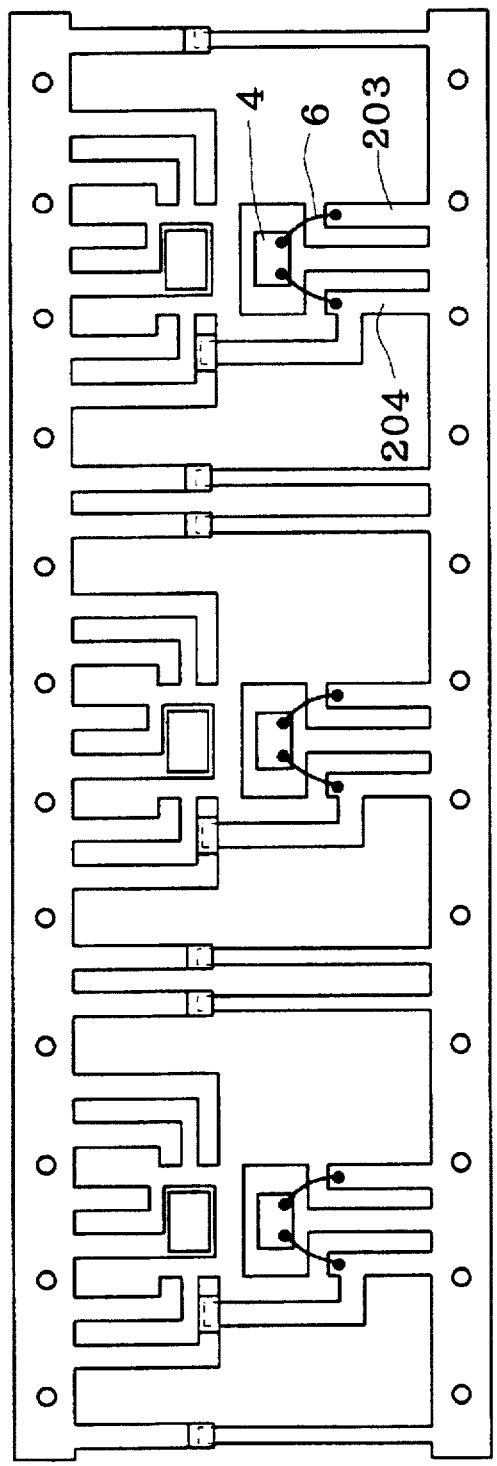
FIG. 9 illustrates a step of fabricating the embodiment 1 according to the present invention.

Each frame unit FU completely die-bonded is transferred to a wire bonding apparatus (wire bonder) for aluminum wires at a step S7, so that the aluminum wires 6 are wire-bonded between respective terminals of each power semiconductor chip 4 and the leads 203 and 204 respectively, as shown in FIG. 9.

Figure 10:
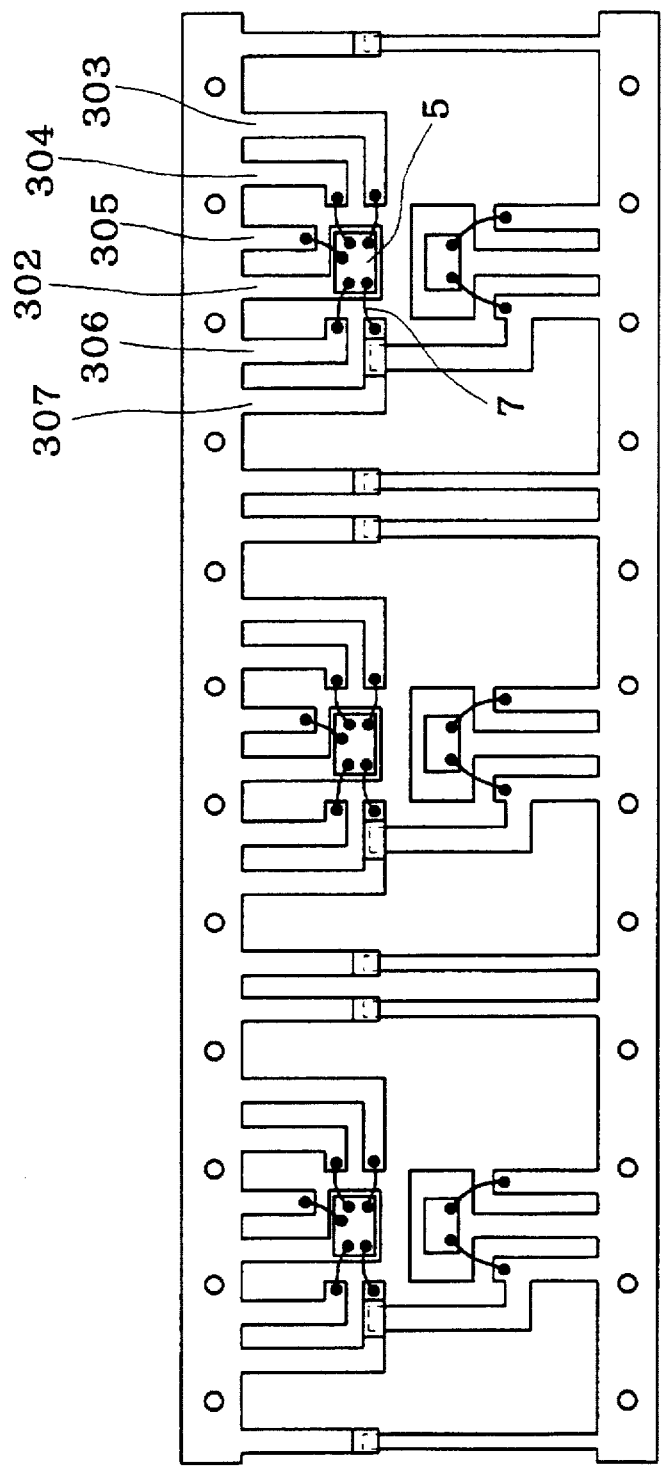
FIG. 10 illustrates a step of fabricating the embodiment 1 according to the present invention.

At a step S8, the frame unit FU is transferred to a wire bonding apparatus (wire bonder) for gold wires, so that the gold wires 7 are wire-bonded between respective terminals of each control semiconductor chip 5 and the leads 303 to 307 respectively, as shown in FIG. 10.

Each frame unit FU completely wire-bonded with the gold wires is carried to a molding apparatus at a step S9, and engaged in a mold assembly. Then, the protective resin member 10 is formed by transfer molding.

Figure 11:
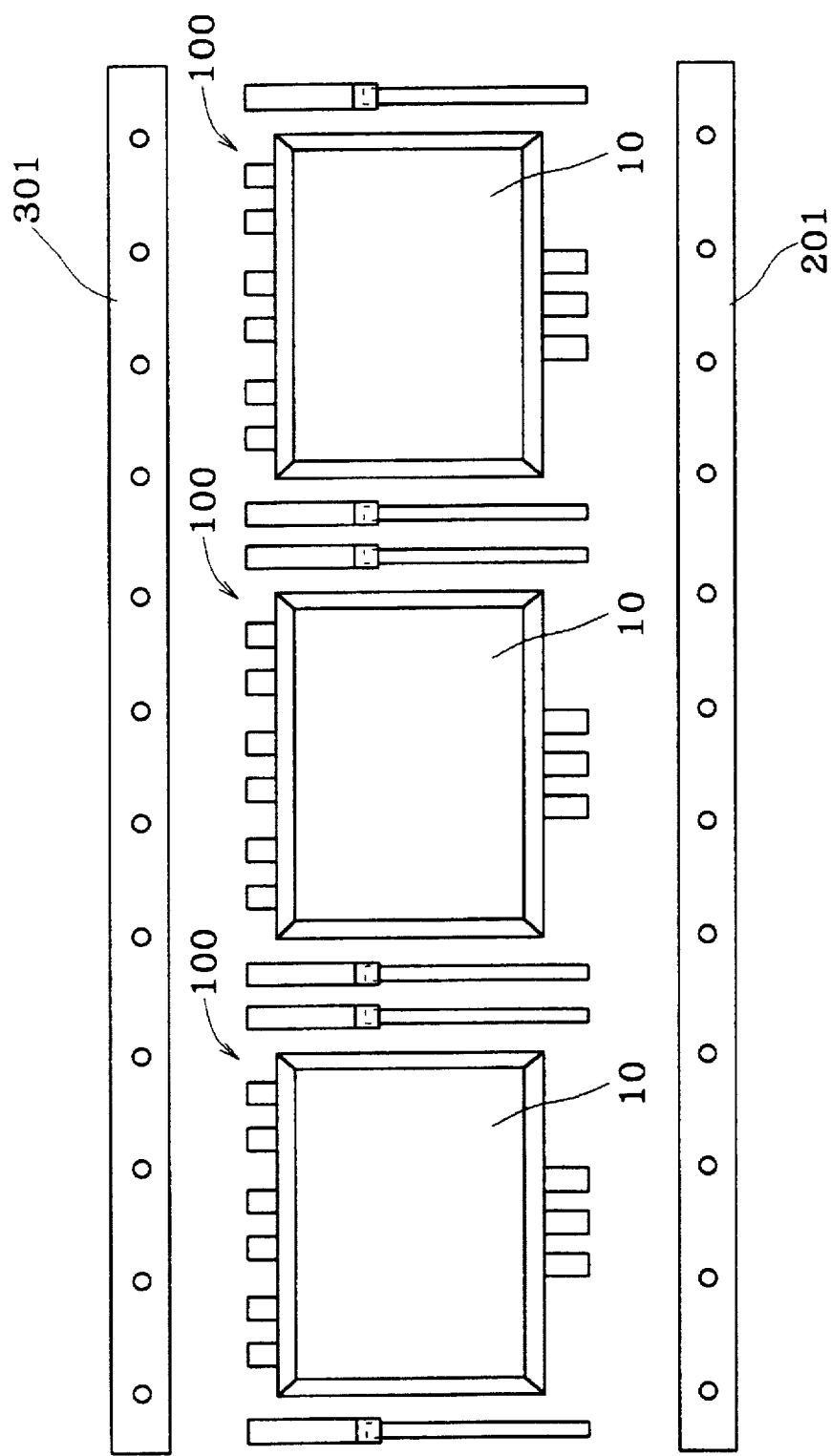
FIG. 11 illustrates a step of fabricating the embodiment 1 according to the present invention.

The tie bars 201 and 301 are cut from each power circuit lead frame 90 and each control circuit lead frame 30 in each frame unit FU which is covered with the protective resin member 10, whereby independent power semiconductor devices 100 are completed as shown in FIG. 11.

While the thickness of the power circuit lead frame 20 is larger than that of the control circuit lead frame 30 in the aforementioned embodiment 1 of the method of fabricating a power semiconductor device according to the present invention, the thicknesses of these lead frames may alternatively be equal to each other, if the control circuit lead frame 30 is formed by a member which can be more readily worked as compared with the power circuit lead frame 20.

<Characteristic Function/Effect>

According to the embodiment 1 of the present invention as described above, the lead forward portion 204a and the junction 307a as well as the joiner forward end portions 205a and 308a are joined with each other at the step S4, whereby the frame unit is structurally strengthened. Therefore, the power circuit lead frame 20 and the control circuit lead frame 30 are prevented from misregistration during movement between the respective steps. In particular, the two lead frames are prevented from misregistration even if the frame unit is raised up to be transferred from the wire bonding step to the transfer molding step, whereby the fine aluminum and gold wires 6 and 7 are not disengaged but the defective ratio in the steps is reduced and automation is simplified.

The rear surfaces of the power circuit lead frame 20 and the control circuit lead frame 30 are flush with each other as shown in FIG. 2, whereby these lead frames can be placed on a heat platen, to be effectively heated for die bonding This also applies to wire bonding of the gold wires.

While it is not necessary to heat the lead frames in wire bonding of the aluminum wires since ultrasonic bonding is employed, the lead frames must be stably placed on a flat plate with no clearance, so that ultrasonic waves are sufficiently transmitted to bonding points. This is a condition which is also necessary in the case of heating. According to the present invention, the frame unit FU is so structurally strengthened that the same can be prevented from deformation, whereby no clearance is defined when the lead frames are placed on the flat plate, and the defective ratio in wire bonding of the aluminum wires can be reduced.

In each power semiconductor device 100 which is fabricated by the present invention, the power circuit lead frame 20 and the control circuit lead frame 30 are structurally separated from each other, whereby the thickness of the former can be increased as compared with the latter, and excellent heat radiation can be attained by employing a member having high heat conductivity such as low-zirconium oxygen-free copper, for example.

Further, the control circuit lead frame 30 can be reduced in thickness, whereby the lead widths of the leads 202 to 204 can also be reduced. In general, workability by press punching depends on the thickness of the member such that working attaining a plane width of not more than 0.8 times the thickness is almost impossible but the plane width is about 1.1 times the thickness in practice. Therefore, the plane width, i.e., the lead width can be reduced if the thickness can be reduced.

If the lead width can be reduced, the space between the bonding points to be connected with the gold wires is also narrowed, whereby the gold wires can be reduced in length. The fabrication cost can be reduced by reducing the gold wires in length, whereby the gold wires can be prevented from inclination in the transfer molding step, so that no inclined gold wires come into contact with adjacent gold wires and adjacent leads to cause operation failures. When low-zirconium oxygen-free copper is employed as the material for the power circuit lead frame 20, not only heat radiation but excellent workability can be attained.

<Embodiment 2>

<Device Structure>

Figure 12:
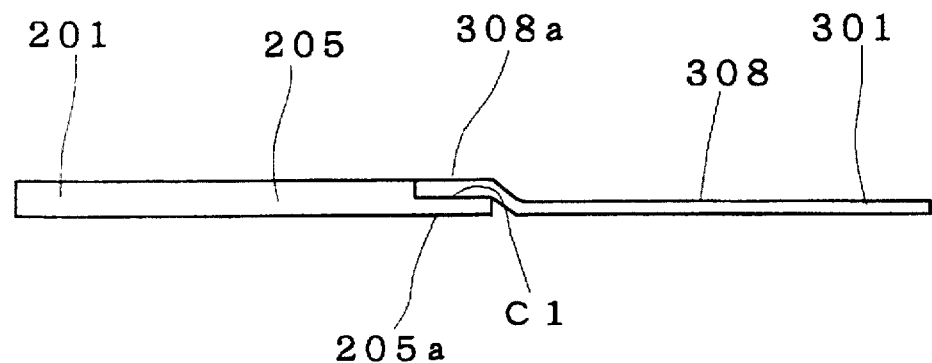
FIG. 12 illustrates an embodiment 2 according to the present invention.

FIG. 12 is a sectional view for illustrating an embodiment 2 of the method of fabricating a power semiconductor device according to the present invention, which corresponds to a section taken along the line B—B in FIG. 1 showing the embodiment 1 of the present invention. A plan view of this embodiment, which is similar to that shown in FIG. 1, is omitted.

Referring to FIG. 12, a joiner forward end portion 205a of a joiner 205 extending from a tie bar 201 of a power circuit lead frame 20 is provided on its surface (hereinafter referred to as an upper surface) which is loaded with a power semiconductor chip 4 with a notched step portion C1 having a vertical difference corresponding to the thickness of a control circuit lead frame 30. When the power circuit lead frame 20 and the control circuit lead frame 30 are so arranged that the notched step portion C1 is covered with a joiner forward end portion 308a of a joiner 308 extending from a tie bar 301 and joined by soldering, for example, in a step of joining the lead frames corresponding to the step S4 described with reference to the flow chart of FIG. 4, therefore, the joiner forward end portion 308a will not project beyond the upper surface of the joiner forward end portion 205a.

A similar structure is employed also in a junction between a lead 307 and a lead forward end portion 204a, which is also provided with a notched step portion C1.

The notched step portion C1 can be formed by pressing a corresponding portion in a step corresponding to the step S1 described with reference to the flow chart of FIG. 4. Therefore, it is not necessary to add a new step.

<Characteristic Function/Effect>

When bonding at a first bonding point is completed in a general wire bonding step, a capillary is upwardly moved from the first bonding point while a sample is horizontally moved (the capillary is only vertically moved) to move a second bonding point to a portion under the capillary. If projections exist in the vicinity of the bonding points, the forward end of the capillary which is not yet sufficiently moved up may collide with the projections during the horizontal movement of the sample.

According to the aforementioned embodiment 2 of the present invention, however, wire bonding of gold wires is performed in such a slate that the joiner forward end portion 308a and the lead 307 do not project beyond the upper surfaces of the joiner forward end portion 205a and the lead forward end portion 204a respectively, whereby the aforementioned problem of collision of the capillary can be solved and the defective ratio in the steps can be reduced.

<Embodiment 3>

<Device Structure>

Figure 13:
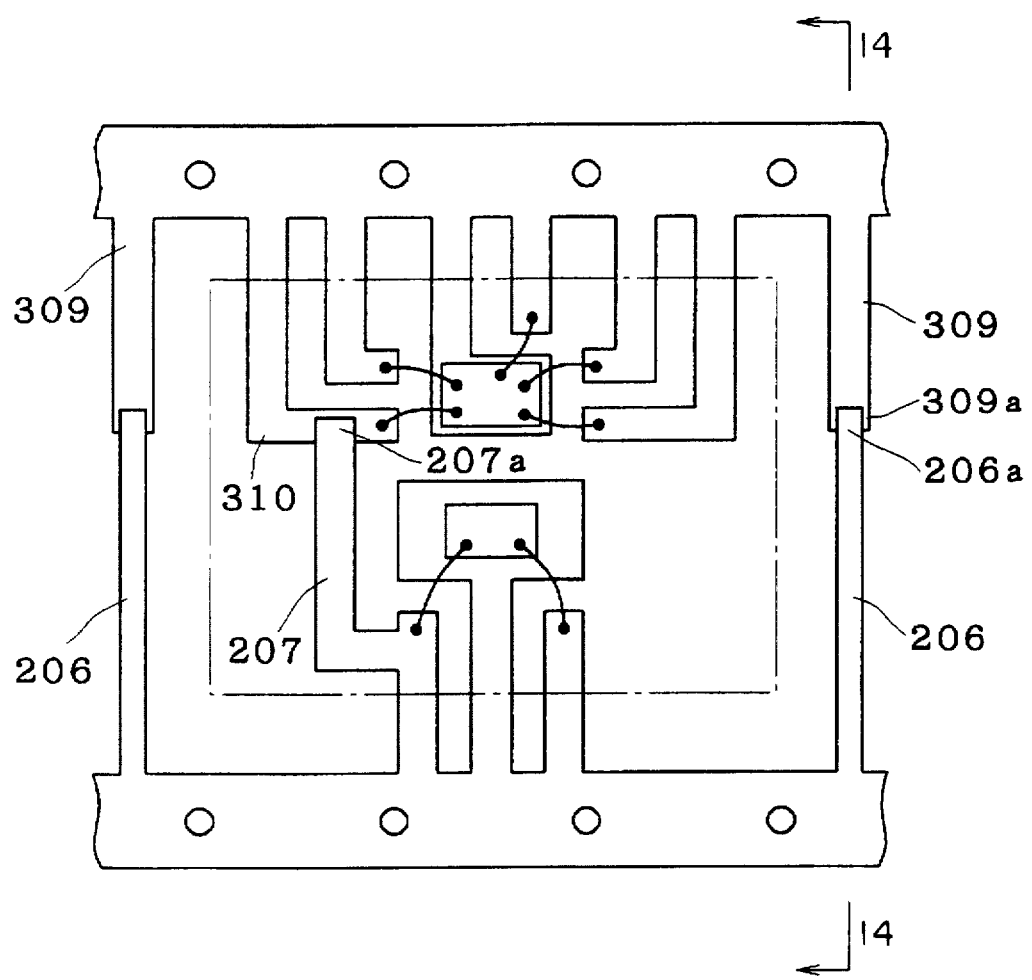
FIG. 13 illustrates an embodiment 3 according to the present invention.

FIG. 13 is a plan view showing one of steps of fabricating a power semiconductor device which is formed by an embodiment 3 of the method of fabricating a power semiconductor device according to the present invention. Reference numerals and redundant description are omitted as to structural parts which are identical to those in FIG. 1. Referring to FIG. 13, the joiners 308 and 205 and the leads 307 and 204 shown in FIG. 1 are replaced with joiners 309 and 206 and leads 310 and 207 respectively.

Figure 14:
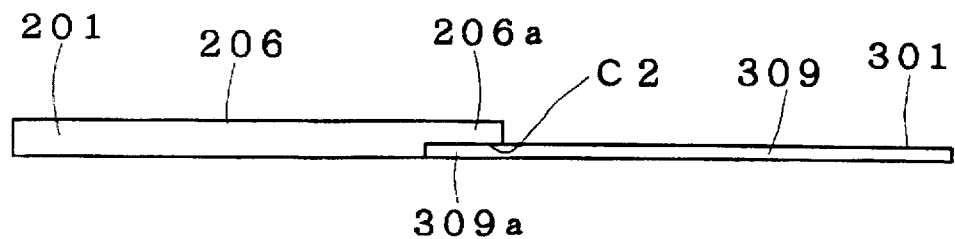
FIG. 14 illustrates the embodiment 3 according to the present invention.

FIG. 14 is a sectional view taken along the line B—B in FIG. 13. Referring to FIG. 14, a joiner forward end portion 206a of the joiner 206 extending from a tie bar 201 of a power circuit lead frame 20 is provided on its rear surface with a notched step portion C2 having a vertical difference corresponding to the thickness of a control circuit lead frame 30. A similar structure is employed also in a junction between the lead 310 and a lead forward end portion 207a, which is also provided with a notched step portion C2. Therefore, the power circuit lead frame 20 and the control circuit lead frame 30 are so arranged that the notched step portion C2 covers a joiner forward end portion 309a of the joiner 309 extending from a tie bar 301 and is joined by soldering, for example, in a step of joining the lead frames corresponding to the step S4 described with reference to the flow chart of FIG. 4.

The notched step portion C2 can be formed by pressing a corresponding portion in a step corresponding to the step S1 described with reference to the flow chart of FIG. 4. Therefore, it is not necessary to add a new step.

<Characteristic Function/Effect>

According to the aforementioned embodiment 3 of the present invention, the joiner forward end portion 309a may not be previously bent, whereby the step S3 described with reference to the flow chart of FIG. 4 is unnecessary and the fabrication steps can be simplified.

Further, the degree of integration can be improved due to omission of a bend-worked portion in the junction between the lead 310 and the lead forward portion 207a.

<Embodiment 4>

Figure 15:
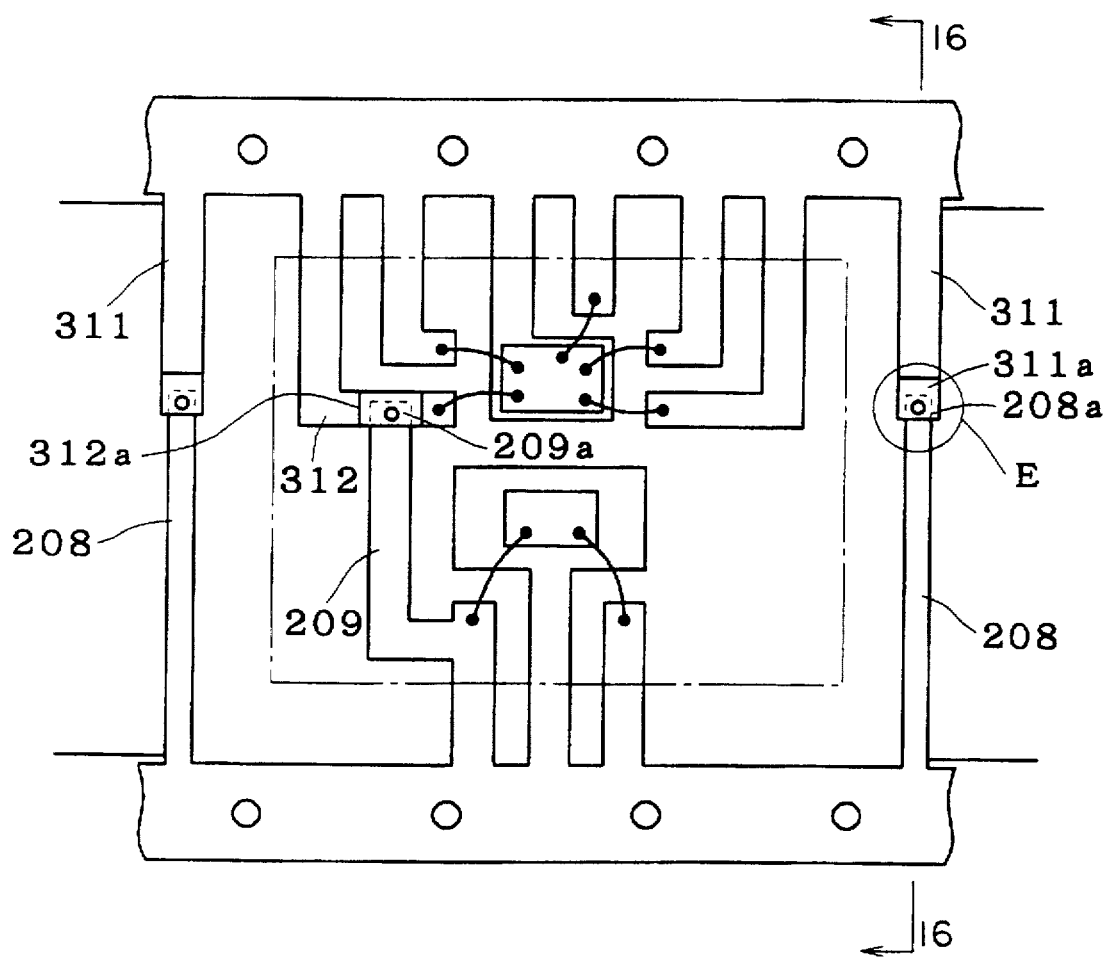
FIG. 15 illustrates an embodiment 4 according to the present invention.

FIG. 15 is a plan view showing one of steps of fabricating a power semiconductor device which is formed by an embodiment 4 of the method of fabricating a power semiconductor device according to the present invention. Reference numerals and redundant description are omitted as to structural parts which are identical to those in FIG. 1. Referring to FIG. 15, the joiners 308 and 205 and the leads 307 and 204 shown in FIG. 1 are replaced with joiners 311 and 208 and leads 312 and 209 respectively.

Figure 16:
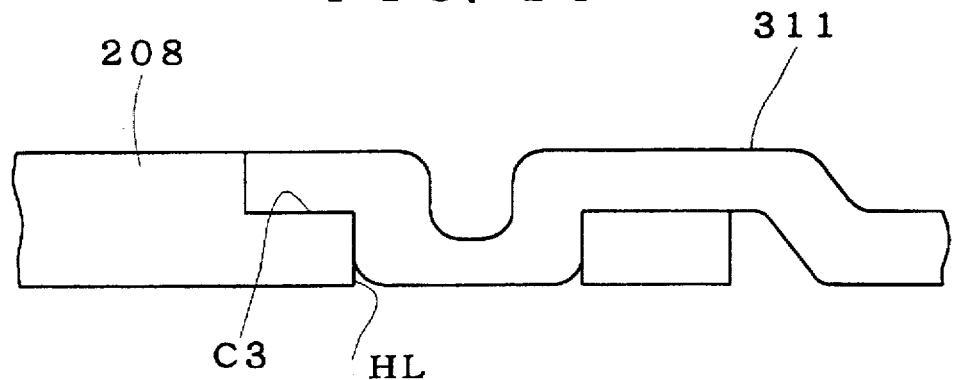
FIG. 16 illustrates the embodiment 4 according to the present invention.

FIG. 16 is a sectional view showing a portion E in FIG. 15 taken along the line B—B. Referring to FIG. 16, a joiner forward end portion 208a of the joiner 208 extending from a tie bar 201 of a power circuit lead frame 20 is provided on its upper surface with a notched step portion C3 having a vertical difference corresponding to the thickness of a control circuit lead frame 30, while a through hole HL is provided in a plane part of the notched step portion C3. A similar structure is employed also in a junction 312a between the lead 312 and a lead forward end portion 209a, which is also provided with a notched step portion C3 and a through hole HL.

Therefore, the power circuit lead frame 20 and the control circuit lead frame 30 are so arranged that the notched step portion C3 is covered with a joiner forward end portion 311a of the joiner 311 extending from a tie bar 301 and the lead forward end portion 209a while the joiner forward end portion 311a and the lead forward end portion 209a are inserted into the through hole HL by a press in a step of joining the lead frames corresponding to the step S4 described with reference to the flow chart of FIG. 4, thereby joining the power circuit lead frame 20 and the control circuit lead frame 30 with each other.

The notched step portion C3 and the through hole HL can be formed by pressing corresponding portions in a step corresponding to the step S1 described with reference to the flow chart of FIG. 4. Therefore, it is not necessary to add a new step.

<Characteristic Function/Effect>

According to the aforementioned embodiment 4 of the present invention, the power circuit lead frame 20 and the control circuit lead frame 30 are joined with each other by pressing, whereby the step can be simplified as compared with soldering requiring a heating step and a solder application step.

While the structure of this embodiment corresponds to that of the embodiment 2, the same may alternatively correspond to that of the embodiment 1 or 3, when a lead forward end portion of a joiner extending from a tie bar 201 of the power circuit lead frame 20 is provided with a through hole HL so that the joiner extending from the tie bar 301 is pressed into the same.

<Embodiment 5>

<Device Structure>

Figure 17:
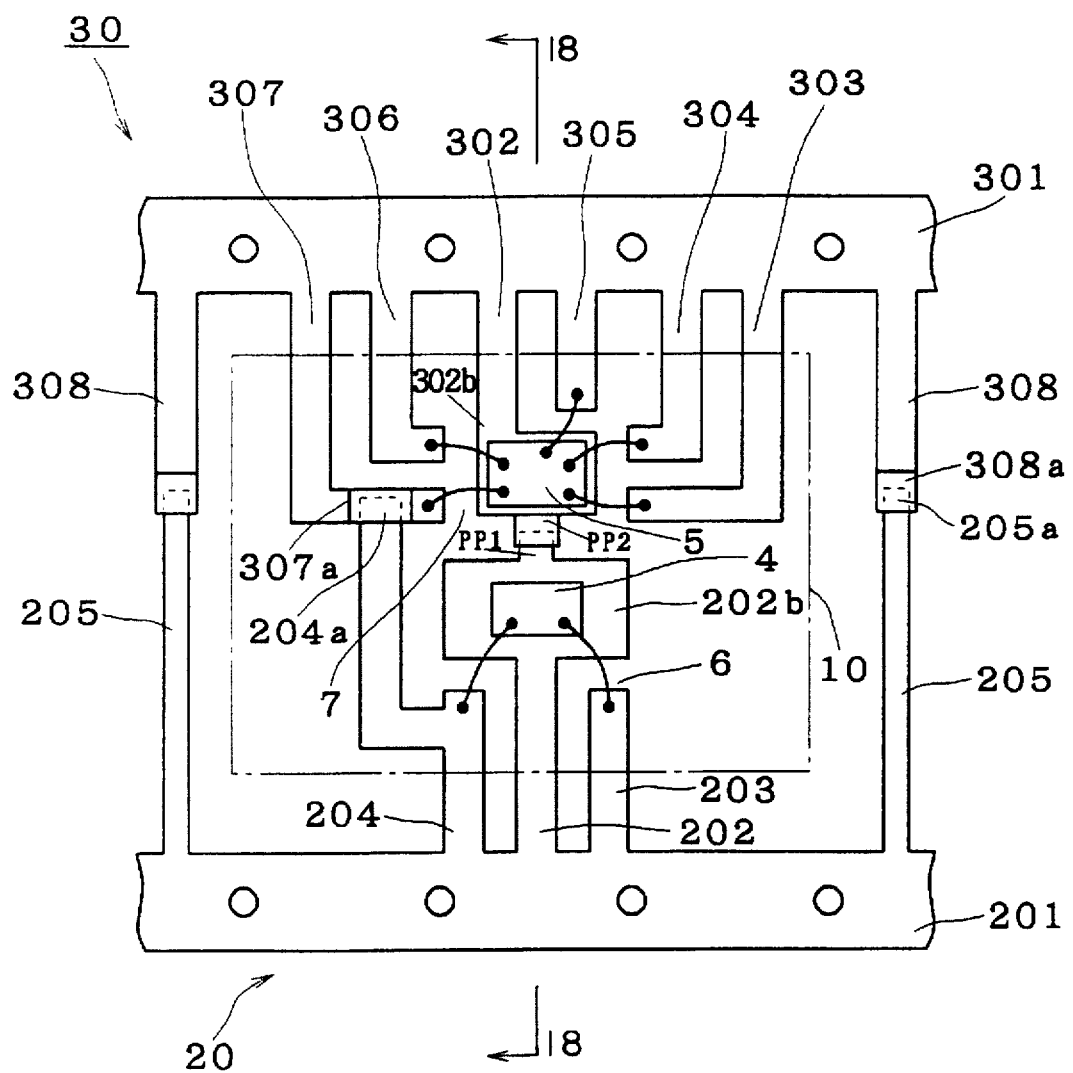
FIG. 17 illustrates an embodiment 5 according to the present invention.

FIG. 17 is a plan view showing one of steps of fabricating a power semiconductor device which is formed by an embodiment 5 of the method of fabricating a power semiconductor device according to the present invention. Reference numerals and redundant description are omitted as to structural parts which are identical to those in FIG. 1. Referring to FIG. 17, the lead forward end portion 202a of the lead 202 and the lead forward end portion 302a of the lead 302 shown in FIG. 1 are replaced with the lead forward end portion 202b and the lead forward end portion 302b respectively. The lead forward end portion 202b and the lead forward end portion 302b have projections PP1 and PP2 respectively on the respective sides opposed to each other.

Figure 18:
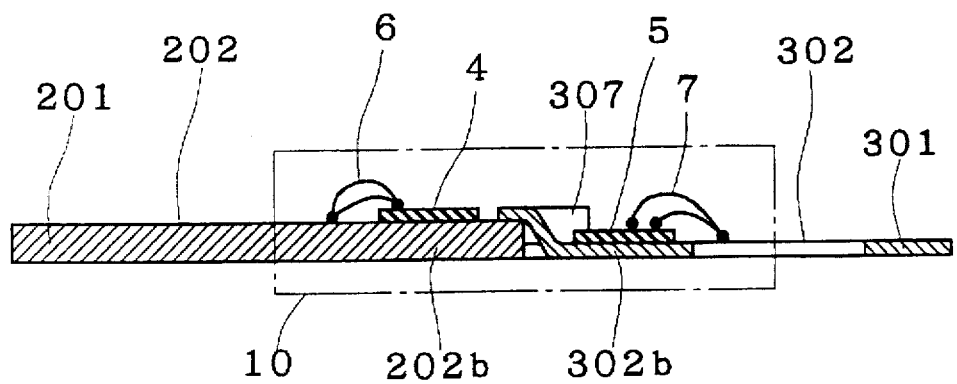
FIG. 18 illustrates the embodiment 5 according to the present invention.

FIG. 18 is a sectional view taken along the line A—A in FIG. 17. As shown in FIG. 18, the projection PP2 is arranged so as to cover the projection PP1. Therefore, the power circuit lead frame 20 and the control circuit lead frame 30 are arranged so that the projection PP2 may cover the projection PP1 and joined by soldering, for example, in a step of joining the lead frames corresponding to the step S4 as described with reference to the flow chart of FIG. 4.

Naturally, there may be a structure where a notched step portion which has a vertical difference corresponding to the thickness of the projection PP2 is provided on an upper surface of the projection PP1 and the projection PP2 is disposed thereover, to prevent the projection PP2 from projecting over the upper surface of the projection PP1, like the embodiment 2 as described with reference to FIG. 12.

<Characteristic Function/Effect>

Figure 19:
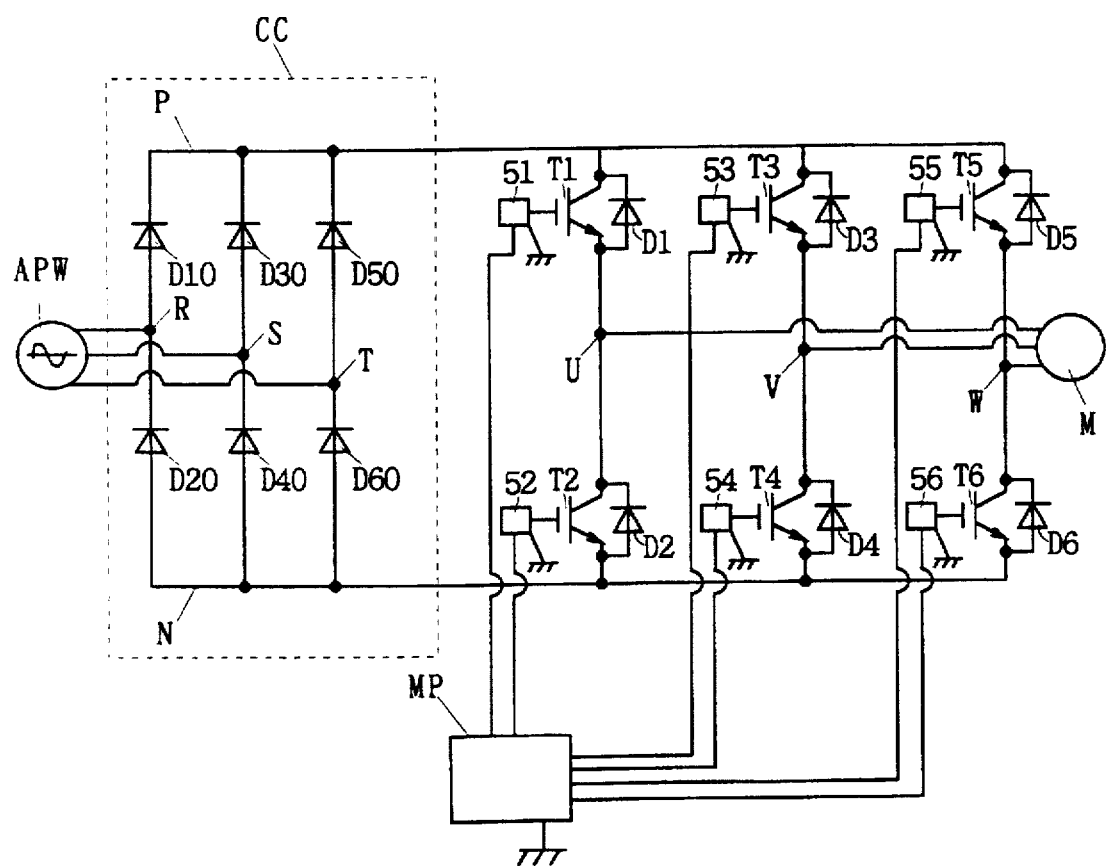
FIG. 19 is a diagram showing a configuration of a driving circuit of an AC input three-phase motor.
Figure 20:
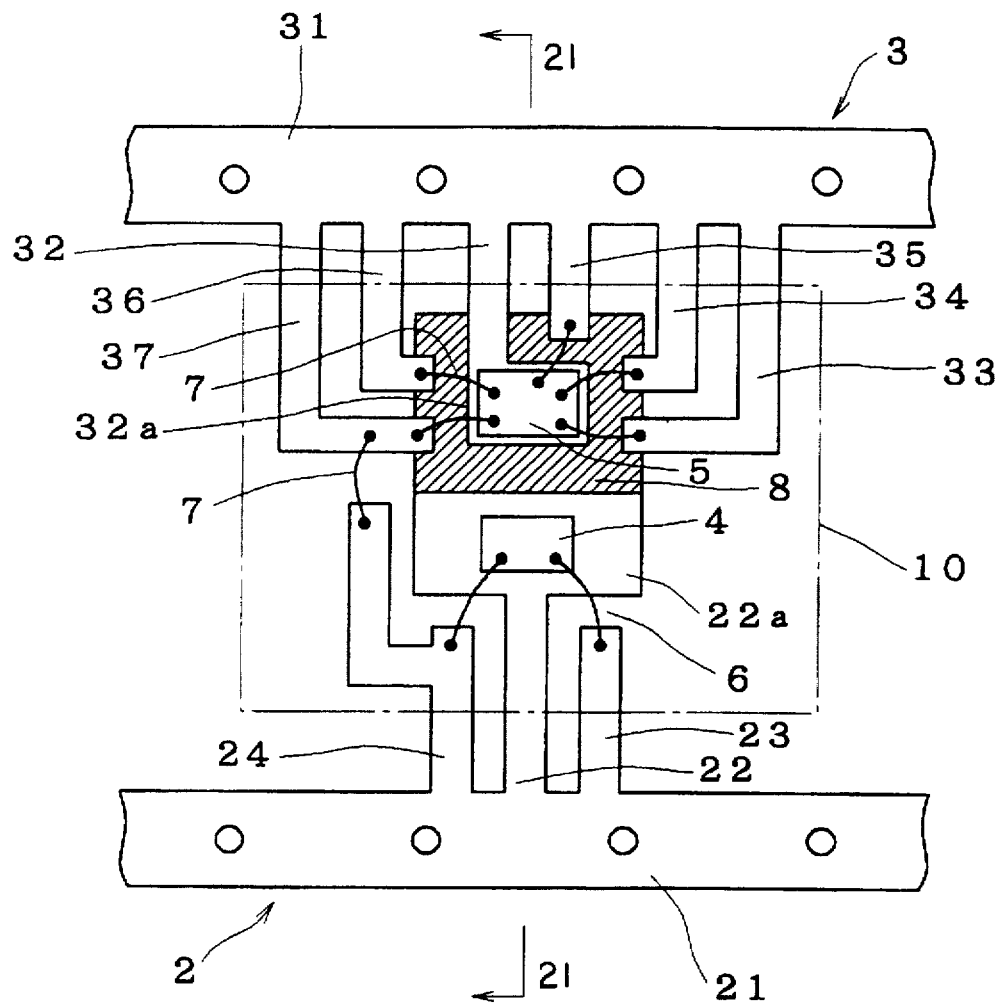
FIG. 20 illustrates a conventional power semiconductor device.
Figure 21:
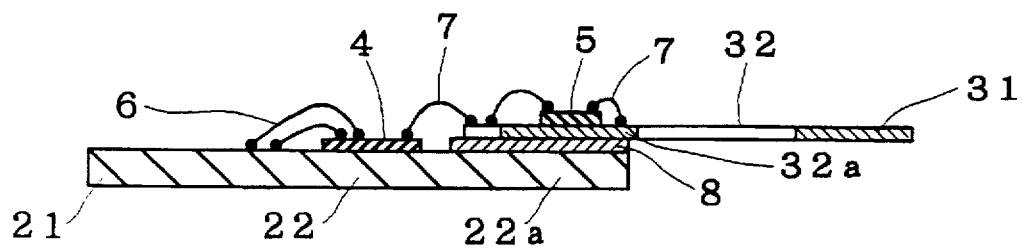
FIG. 21 illustrates the conventional power semiconductor device.

As an example of the power semiconductor device according to the embodiment 5 of the present invention, a general driving circuit of an AC input three-phase motor is shown in FIG. 19. An AC three-phase power supply APW which supplies an AC input three-phase motor M with power is connected to a convertor circuit CC disposed between lines P and N in FIG. 19. The convertor CC consists of serially-connected diodes D10 and D20, serially-connected diodes D30 and D40, and serially-connected diodes D50 and D60, which are connected in parallel between the lines P and N.

Totem-pole-connected transistors T1 and T2 (T3 and T4, T5 and T6), each of which is a power device such as an IGBT (Insulated Gate Bipolar Transistor), are connected between the lines P and N. Further, control elements 51 to 56 are connected to the transistors T1 to T6, and free-wheeling diodes D1 to D6 are connected in inverse-parallel to the transistors T1 to T6, respectively. The control elements 51 to 56 are connected to an externally-provided control device MP, such as MPU (microprocessor unit).

Input ends for the respective phases of the motor M are connected to nodes U, V and W of the totem-pole-connected transistors, respectively.

When the power semiconductor device of the present invention is applied to the above-configured driving circuit of the AC input three-phase motor, the transistors T1 to T6 correspond to the power semiconductor chip 4 and the control elements 51 to 56 correspond to the control semiconductor chip 5.

Normally, the AC three-phase power supply APW has a voltage of 100 V or 200 V. Accordingly, the voltage of 100 V or 200 V is applied to the power semiconductor chip 4 (i.e., the transistors T1 to T6) and the applied voltage value always varies. On the other hand, a voltage of about 5 V is normally applied to the control semiconductor chip 5 (i.e., the control elements 51 to 56), being kept constant.

The variation in the voltage applied to the power semiconductor chip 4 causes malfunction of the control semiconductor chip 5, and specifically, the control semiconductor chip 5 may turn on the power semiconductor chip 4 when it should not be turned on or may turn it off when it should not be turned off.

To prevent the above malfunction as much as possible, a carrying pad (i.e., the lead forward end portion 202b) for the transistors T2, T4 arid T6 connected to the grounded line N and a carrying pad (i.e., the lead forward end portion 302b) for the control elements 52, 54 and 56 are connected in common to the ground potential.

The carrying pads, however, are not connected direct to each other but connected indirect through various paths, and therefore variation in the grounded potential due to the variation in the voltage applied to the power semiconductor chip 4 produces a difference between the potentials of the lead forward end portions 202b and 302b, causing malfunction of the control semiconductor chip 5.

In the power semiconductor device according to the embodiment 5 of the present invention, the projections PP1 and PP2 are joined and electrically connected direct to each other. That prevents a difference between the potentials of the lead forward end portions 202b and 302b from being produced to keep the two potentials equivalent even when the voltage applied to the power semiconductor chip 4 varies, thus avoiding malfunction of the control semiconductor chip 5.

A carrying pad for the transistors T1, T3 and T5 connected to the line P for transmitting the power supply potential and a carrying pad for the control elements 51, 53 and 55 can not be electrically connected to each other. Therefore, the embodiment 5 of the present invention can not be applied to this part.

<Variation>

The power semiconductor device as described with reference to FIG. 17 has one lead forward end portion 202b and one lead forward end portion 302b, which carry one power semiconductor chip 4 and one control semiconductor chip 5 respectively. When the structure is applied to the driving circuit of the AC input three-phase motor of FIG. 19, the transistor T2 and the control element 52, for example, are loaded on the lead forward end portions 202b and 302b, respectively.

Recently, a power semiconductor device in which one control semiconductor chip controls a plurality of power semiconductor chips has been developed. The device is provided with one carrying pad for the control element and a plurality of carrying pads for power devices. In this case, it is only required that any one of a plurality of carrying pads for power devices is connected to the carrying pad for the control element.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a power semiconductor device having a power semiconductor element and a control semiconductor element for controlling said power semiconductor element being stored in the same package, said method comprising the steps of:

(a) preparing a power circuit lead frame comprising a power lead group unidirectionally extending from a first tie bar and including a first lead having a power semiconductor element mounting region being loaded with said power semiconductor element, and at least one first joiner being formed on said first tie bar on a side of said power lead group to extend in the same direction as said power lead group;

(b) preparing a control circuit lead frame comprising a control lead group unidirectionally extending from a second tie bar and including a second lead having a control semiconductor element mounting region being loaded with said control semiconductor element, and at least one second joiner being formed on said second tie bar on a side of said control lead group to extend in the same direction as said control lead group;

(c) arranging said power circuit lead frame and said control circuit lead frame to oppose said power lead group and said control lead group to each other and joining forward end portions of said first and second joiners with each other thereby integrating said power circuit lead frame and said control circuit lead frame with each other;

(d) loading said power semiconductor element on said power semiconductor element mounting region and electrically connecting the same with said power lead group;

(e) loading said control semiconductor element on said control semiconductor element mounting region and electrically connecting the same with said control lead group; and (f) storing said power semiconductor element and said control semiconductor element in the same said package by resin molding, said steps (d) to (f) being carried out in a state of integrating said power circuit lead frame and said control circuit lead frame with each other through said step (c).

2. The method of fabricating a power semiconductor device in accordance with claim 1, wherein said control circuit lead frame is made of a material satisfying at least either one of conditions of being smaller in thickness than said power circuit lead frame or being easier in working than said power circuit lead frame, said step (b) includes a step of bending said forward end portion of said second joiner while placing the same on said forward end portion of said first joiner so that rear surfaces of said power semiconductor element mounting region and said control semiconductor element mounting region are flush with each other and said step (c) includes a step of placing said forward end portion of said second joiner on that of said first joiner and soldering the same to each other.

3. The method of fabricating a power semiconductor device in accordance with claim 1, wherein said control circuit lead frame is made of a material being smaller in thickness than said power circuit lead frame, said step (a) includes a step of forming a notched step portion having a vertical difference corresponding to the thickness of said control circuit lead frame on an upper surface of said forward end portion of said first joiner, said step (b) includes a step of bending said forward end portion of said second joiner while placing the same on said forward end portion of said first joiner so that rear surfaces of said power semiconductor element mounting region and said control semiconductor element mounting region are flush with each other, and said step (c) includes a step of placing said forward end portion of said second joiner on said notched step portion of said first joiner and soldering the same to each other.

4. The method of fabricating a power semiconductor device in accordance with claim 1, wherein said control circuit lead frame is made of a material being smaller in thickness than said power circuit lead frame, said step (a) includes a step of forming a notched step portion having a vertical difference corresponding to the thickness of said control circuit lead frame on a rear surface of said forward end portion of said first joiner, and said step (c) includes a step of covering said forward end portion of said second joiner with said notched step portion of said first joiner and soldering the same to each other.

5. The method of fabricating a power semiconductor device in accordance with claim 1, wherein said control circuit lead frame is made of a material satisfying at least either one of conditions of being smaller in thickness than said power circuit lead frame or being easier in working than said power circuit lead frame, said step (a) includes a step of forming a through hole passing through said forward end portion of said first joiner, said step (b) includes a step of bending said forward end portion of said second joiner while placing the same on said forward end portion of said first joiner so that rear surfaces of said power semiconductor element mounting region and said control semiconductor element mounting region are flush with each other, and said step (c) includes a step of placing said forward end portion of said second joiner on that of said first joiner and inserting the same into said through hole by press working.

6. The method of fabricating a power semiconductor device in accordance with claim 1, wherein said control circuit lead frame is made of a material being smaller in thickness than said power circuit lead frame, said step (a) includes a step of forming a notched step portion having a vertical difference corresponding to the thickness of said control circuit lead frame on an upper surface of said forward end portion of said first joiner, and a step of forming a through hole in said notched step portion, said step (b) includes a step of bending said forward end portion of said second joiner while placing the same on said notched step portion of said first joiner so that rear surfaces of said power semiconductor element mounting region and said control semiconductor element mounting region are flush with each other, and said step (c) includes a step of placing said forward end portion of said second joiner on said notched step portion of said first joiner and inserting the same into said through hole by press working.

7. The method of fabricating a power semiconductor device in accordance with claim 1, wherein said control circuit lead frame is made of a material being smaller in thickness than said power circuit lead frame, said step (a) includes a step of forming a notched step portion having a vertical difference corresponding to the thickness of said control circuit lead frame on a rear surface of said forward end portion of said first joiner, and a step of forming a through hole in said notched step portion, and said step (c) includes a step of covering said forward end portion of said second joiner with said notched step portion of said first joiner and inserting the same into said through hole by press working.

8. A lead frame being employed for fabricating a power semiconductor device having a power semiconductor element and a control semiconductor element for controlling said power semiconductor element being stored in the same package, said lead frame comprising:

a power circuit lead frame comprising a power lead group unidirectionally extending from a first tie bar and including a first lead having a power semiconductor element mounting region being loaded with said power semiconductor element, and at least one first joiner being formed on said first tie bar on a side of said power lead group to extend in the same direction as said power lead group; and a control circuit lead frame comprising a control lead group unidirectionally extending from a second tie bar and including a second lead having a control semiconductor element mounting region being loaded with said control semiconductor element, and at least one second joiner being formed on said second tie bar on a side of said control lead group to extend in the same direction as said control lead group, said power circuit lead frame and said control circuit lead frame being so arranged that said power lead group and said control lead group are opposed to each other and rear surfaces of said power semiconductor element mounting region and said control semiconductor element mounting region are flush with each other, forward end portions of said first and second joiners being joined with each other.

9. The lead frame in accordance with claim 8, wherein said control circuit lead frame is made of a material satisfying at least either one of conditions of being smaller in thickness than said power circuit lead frame or being easier in working than said power circuit lead frame, those of said leads of said power lead group and said control lead group having potentials in common being directly joined with each other.

10. The lead frame in accordance with claim 8, wherein said power semiconductor element mounting region and said control semiconductor element mounting region have a first projection and a second projection respectively which project in such directions as to be opposed to each other, and a forward end portion of said first projection and a forward end portion of said second projection are joined.

11. The lead frame in accordance with claim 8, wherein said power circuit lead frame and said control circuit lead frame are made of low-zirconium oxygen-free copper.

12. The lead frame in accordance with claim 8, wherein the thickness of said power circuit lead frame is not more than ten times as large as that of said control circuit lead frame.

* * * * *